(12) United States Patent
Tauchi et al.

(10) Patent No.: US 8,431,931 B2
(45) Date of Patent: Apr. 30, 2013

(54) REFLECTIVE ANODE AND WIRING FILM FOR ORGANIC EL DISPLAY DEVICE

(75) Inventors: Yuuki Tauchi, Kobe (JP); Mototaka Ochi, Kobe (JP); Toshiki Sato, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 13 days.

(21) Appl. No.: 13/128,415

(22) PCT Filed: Nov. 9, 2009

(86) PCT No.: PCT/JP2009/069068
§ 371 (c)(1),
(2), (4) Date: May 10, 2011

(87) PCT Pub. No.: WO2010/053183
PCT Pub. Date: May 14, 2010

(65) Prior Publication Data
US 2011/0220903 A1    Sep. 15, 2011

(30) Foreign Application Priority Data

Nov. 10, 2008  (JP) ................................ 2008-288084
Feb. 26, 2009  (JP) ................................ 2009-043409
Aug. 10, 2009  (JP) ................................ 2009-186075

(51) Int. Cl.
*H01L 31/00*        (2006.01)
(52) U.S. Cl.
USPC  257/59; 257/762; 257/E33.063; 257/E33.053; 428/673; 428/457; 428/702; 428/701; 428/698

(58) Field of Classification Search ............ 257/59
See application file for complete search history.

(56) References Cited

U.S. PATENT DOCUMENTS

| | | | |
|---|---|---|---|
| 5,948,497 A | 9/1999 | Hatwar et al. | |
| 6,007,889 A | 12/1999 | Nee | |
| 6,280,811 B1 | 8/2001 | Nee | |
| 6,451,402 B1 | 9/2002 | Nee | |
| 6,689,444 B2 | 2/2004 | Nakai et al. | |

(Continued)

FOREIGN PATENT DOCUMENTS

| | | |
|---|---|---|
| JP | 4 28032 | 1/1992 |
| JP | 4 252440 | 9/1992 |

(Continued)

OTHER PUBLICATIONS

Japanese Office Action issued Mar. 21, 2012, in Patent Application No. 2010-049466 (with English-language translation).

(Continued)

*Primary Examiner* — Kyoung Lee
*Assistant Examiner* — Ankush Singal
(74) *Attorney, Agent, or Firm* — Oblon, Spivak, McClelland, Maier & Neustadt, L.L.P.

(57) ABSTRACT

To avoid a phenomenon of deterioration which is characteristic to an organic EL display device, such as a dark spot, without forming a pin hole in an organic material used for forming an organic EL layer. A reflective anode for an organic EL display device includes: an Ag-based alloy film (6) containing 0.01 to 1.5 atomic % of Nd and formed on a substrate (1); and an oxide conductive film (7) formed on the Ag-based alloy film (6) and in direct contact with the film (6).

22 Claims, 7 Drawing Sheets

U.S. PATENT DOCUMENTS

| | | |
|---|---|---|
| 7,022,384 B2 | 4/2006 | Fujii et al. |
| 7,203,003 B2 | 4/2007 | Nakai et al. |
| 7,419,711 B2 | 9/2008 | Tauchi et al. |
| 7,452,604 B2 | 11/2008 | Takagi et al. |
| 7,476,431 B2 | 1/2009 | Tauchi et al. |
| 7,507,458 B2 | 3/2009 | Takagi et al. |
| 7,514,037 B2 | 4/2009 | Tauchi et al. |
| 7,517,575 B2 | 4/2009 | Fujii et al. |
| 7,566,417 B2 | 7/2009 | Tauchi et al. |
| 7,695,790 B2 | 4/2010 | Tauchi et al. |
| 7,695,792 B2 | 4/2010 | Tauchi et al. |
| 7,704,581 B2 | 4/2010 | Takagi et al. |
| 7,713,608 B2 | 5/2010 | Nakai et al. |
| 7,722,942 B2 | 5/2010 | Tauchi et al. |
| 7,754,307 B2 | 7/2010 | Tauchi et al. |
| 7,758,942 B2 | 7/2010 | Tauchi et al. |
| 7,767,041 B2 | 8/2010 | Takagi et al. |
| 7,776,420 B2 | 8/2010 | Tauchi et al. |
| 7,790,263 B2 | 9/2010 | Nakano et al. |
| 7,833,604 B2 | 11/2010 | Tsubota et al. |
| 7,843,796 B2 | 11/2010 | Sakamoto et al. |
| 7,871,686 B2 | 1/2011 | Tauchi et al. |
| 2002/0034603 A1 | 3/2002 | Nee |
| 2002/0122913 A1 | 9/2002 | Nee |
| 2003/0053791 A1* | 3/2003 | Yoshida ............... 385/147 |
| 2003/0138591 A1 | 7/2003 | Nee |
| 2003/0143342 A1 | 7/2003 | Fujii et al. |
| 2003/0215598 A1 | 11/2003 | Nee |
| 2004/0018334 A1 | 1/2004 | Nee |
| 2004/0028912 A1 | 2/2004 | Tauchi et al. |
| 2004/0151866 A1 | 8/2004 | Nee |
| 2004/0151867 A1 | 8/2004 | Nee |
| 2004/0164297 A1* | 8/2004 | Kaneko et al. ............ 257/59 |
| 2004/0191463 A1 | 9/2004 | Nee |
| 2004/0191683 A1* | 9/2004 | Nishihara et al. ....... 430/270.11 |
| 2004/0226818 A1 | 11/2004 | Takagi et al. |
| 2004/0238356 A1 | 12/2004 | Matsuzaki et al. |
| 2004/0258872 A1 | 12/2004 | Nee |
| 2005/0019203 A1 | 1/2005 | Saitoh et al. |
| 2005/0042406 A1 | 2/2005 | Nee |
| 2005/0112019 A1 | 5/2005 | Nakai et al. |
| 2005/0153162 A1 | 7/2005 | Takagi et al. |
| 2005/0170134 A1 | 8/2005 | Nee |
| 2005/0213004 A1* | 9/2005 | Sakamoto et al. ............ 349/114 |
| 2005/0230684 A1 | 10/2005 | Seo et al. |
| 2006/0104853 A1 | 5/2006 | Tauchi et al. |
| 2006/0145159 A1 | 7/2006 | Yokoyama et al. |
| 2006/0154104 A1* | 7/2006 | Tauchi et al. ............ 428/673 |
| 2006/0171842 A1 | 8/2006 | Tauchi et al. |
| 2006/0177768 A1 | 8/2006 | Tauchi et al. |
| 2006/0182991 A1 | 8/2006 | Tauchi et al. |
| 2006/0243976 A1* | 11/2006 | Shin ............... 257/59 |
| 2006/0279190 A1* | 12/2006 | Nakayama ............ 313/113 |
| 2007/0020427 A1* | 1/2007 | Fujii et al. ............ 428/64.4 |
| 2007/0037402 A1 | 2/2007 | Inoue |
| 2007/0114526 A1 | 5/2007 | Yokoyama et al. |
| 2007/0252520 A1* | 11/2007 | Hasegawa ............ 313/504 |
| 2008/0002562 A1* | 1/2008 | Morita et al. ............ 369/275.4 |
| 2008/0075910 A1 | 3/2008 | Ohwaki et al. |
| 2008/0171196 A1* | 7/2008 | Sato et al. ............ 428/336 |
| 2008/0203908 A1* | 8/2008 | Hasegawa et al. ............ 313/504 |
| 2008/0317993 A1 | 12/2008 | Tauchi et al. |
| 2009/0022933 A1* | 1/2009 | Furomoto et al. ............ 428/64.8 |
| 2009/0057140 A1 | 3/2009 | Takagi et al. |
| 2009/0057141 A1 | 3/2009 | Tauchi et al. |
| 2009/0061142 A1 | 3/2009 | Tauchi et al. |
| 2009/0117313 A1 | 5/2009 | Tauchi et al. |
| 2009/0139860 A1 | 6/2009 | Matsuzaki |
| 2010/0038233 A1 | 2/2010 | Takagi et al. |
| 2010/0065425 A1 | 3/2010 | Matsuzaki et al. |
| 2010/0074094 A1 | 3/2010 | Sakamoto et al. |
| 2010/0117999 A1* | 5/2010 | Matsunaga et al. ............ 345/204 |
| 2010/0202280 A1 | 8/2010 | Nakai et al. |
| 2010/0226240 A1 | 9/2010 | Jiko et al. |
| 2011/0003168 A1 | 1/2011 | Jiko et al. |
| 2011/0042135 A1 | 2/2011 | Tauchi et al. |

FOREIGN PATENT DOCUMENTS

| | | |
|---|---|---|
| JP | 05 258363 | 10/1993 |
| JP | 6 208732 | 7/1994 |
| JP | 6 302027 | 10/1994 |
| JP | 9 274990 | 10/1997 |
| JP | 2000 57627 | 2/2000 |
| JP | 2001 184725 | 7/2001 |
| JP | 2002 323611 | 11/2002 |
| JP | 2003 160826 | 6/2003 |
| JP | 2004 061845 | 2/2004 |
| JP | 2004-126497 | 4/2004 |
| JP | 2004 158145 | 6/2004 |
| JP | 2004 333882 | 11/2004 |
| JP | 2004 339585 | 12/2004 |
| JP | 2005 11792 | 1/2005 |
| JP | 2005 48231 | 2/2005 |
| JP | 2005-54268 | 3/2005 |
| JP | 2005 187937 | 7/2005 |
| JP | 2005 259695 | 9/2005 |
| JP | 2006-28641 | 2/2006 |
| JP | 2006 37169 | 2/2006 |
| JP | 2006 70345 | 3/2006 |
| JP | 2006 310317 | 11/2006 |
| JP | 2008 108533 | 5/2008 |
| WO | 98 09823 | 3/1998 |

OTHER PUBLICATIONS

International Search Report issued Jan. 12, 2010 in PCT/JP09/069068 filed Nov. 9, 2009.

Office Action issued Jan. 5, 2010 in Japanese Patent Application No. 2009-186075 filed Aug. 10, 2009 (with English language translation).

Office Action issued Nov. 24, 2010 in Japanese Patent Application No. 2009-186075 filed Aug. 10, 2009 (with English language translation).

U.S. Appl. No. 13/062,384, filed Mar. 4, 2011, Jiko, et al.

U.S. Appl. No. 13/062,874, filed Mar. 8, 2011, Tauchi, et al.

* cited by examiner (a) Pure Ag
Ra=4.2nm, Rz=43nm (b) Ag-1.0Bi
Ra=0.7nm, Rz=7nm (c) Ag-0.4Nd-0.6Cu
Ra=0.5nm, Rz=6nm (a)

(b)

(a)

(b)

(a)

(b)

REFLECTIVE ANODE AND WIRING FILM FOR ORGANIC EL DISPLAY DEVICE

TECHNICAL FIELD

The present invention relates to a reflective anode, a wiring film, and a thin-film transistor substrate for use in an organic EL display device (particularly, top emission type), and a sputtering target.

BACKGROUND ART

An organic electroluminescence (which may be hereinafter described as an "organic EL") display device which is one of self-emitting type flat panel display devices is an all solid-state flat panel display device in which organic EL devices are arrayed in a matrix on a substrate such as a glass substrate. In the organic EL display device, anodes and cathodes are formed in stripes, the portions of intersection of which correspond to pixels (organic EL devices). The organic EL devices are externally applied with a voltage of several volts, so that a current flows therethrough. As a result, organic molecules are raised to the excited state. When the organic molecules return to the base state (stable state), they emit an extra energy thereof as a light. The luminescence color is inherent in the organic material.

The organic EL devices are devices self-emitting type and current-driving type. The driving type is classified into a passive matrix type and an active matrix type. The passive matrix type is simple in structure, but has a difficulty in providing full color. On the other hand, the active matrix type can be increased in size, and is also suitable for providing full color, but requires a TFT substrate. For the TFT substrates, a low-temperature polycrystal Si (p-Si), amorphous Si (a-Si), or other TFTs are used.

In the case of the active matrix type organic EL display device, a plurality of TFTs and wires become obstacles, resulting in reduction of the area usable for organic EL pixels. As the driving circuit becomes complicated, and the number of TFTs increases, the effects thereof increase. In recent years, attention has been focused on the method for improving the aperture ratio not by extracting light from a glass substrate, but by adopting a structure in which light is extracted from the top surface side (top emission system).

With the top emission system, for the anode on the bottom surface, ITO: Indium Tin Oxide excellent in hole injection is used. Whereas, for the cathode on the top surface, it is necessary to use a transparent conductive film. However, ITO has a large work function, and is not suitable for electron injection. Further, ITO is deposited with a sputtering method or an ion beam deposition method. This leads to a fear of damage to the electron transport layer (organic material forming organic EL devices) due to plasma ions and secondary electrons during deposition. For this reason, by forming a thin MG layer or copper phthalocyanine layer on the electron transport layer, electron injection is improved, and the damage is avoided.

Partly for the purpose of reflecting light emitted from an organic EL device, the anode for use in such an active matrix type top-emission organic EL display device forms a lamination structure of a transparent oxide conductive film typified by ITO or IZO: Indium Zinc Oxide and a reflective film. For the reflective film herein used, there is often used a metal film with a high reflectivity such as molybdenum-, chromium-, or aluminum-based one (Patent Literature 1), silver-based one (Patent Literature 2), or the like.

Incidentally, the present applicant has heretofore proposed an Ag-based alloy as for a liquid crystal display device (Patent Literature 3), and an Ag-based alloy as for a liquid crystal display device (Patent Literature 4).

CITATION LIST

Patent Literature

[PTL 1] JP-A-2005-259695
[PTL 2] JP-A-2006-310317
[PTL 3] JP-A-2005-187937
[PTL 4] JP-A-2002-323611

DISCLOSURE OF THE INVENTION

Technical Problem

However, for pure Ag or an Ag-based alloy having a high reflectivity, atoms tend to move even with a low-temperature heating. Particularly, atoms tend to be aggregated readily in a wet atmosphere. These are also aggregated readily even with heating. For this reason, protective films are required to be provided on and under the Ag thin film. Even when the protective films are provided, there is often observed the case where alteration (generation of white spots or white turbidity) readily occurs with the film defects and the like as the starting points. When these phenomena occur in an organic electroluminescence device, the emission luminance becomes ununiform, resulting in image speckle. Further, in the organic electroluminescence device, the organic layer which is a light-emitting layer is very thin. For this reason, when the surface smoothness of the underlying film is bad, pin holes are formed in the organic layer. When aggregation of the Ag thin film occurs, a further larger number of pin holes are formed. The pin holes cause device characteristic defects referred to as dark spots. Thus, particularly when pure Ag or an Ag-based alloy is used for an organic electroluminescence display device, a large number of problems occur in device manufacturing steps or device characteristics.

For example, in the Patent Literature 2, an Ag—Sm alloy, an Ag—Tb alloy, and the like are disclosed as the reflective films for an organic EL display device. However, these alloys are not enough for preventing aggregation of the Ag thin film.

On the other hand, in the Patent Literatures 3 and 4, as the reflective film of a liquid crystal display device, an Ag—Nd alloy, an Ag—Bi alloy, or the like is disclosed. However, verification has not yet been made on the following: in specific conditions of being used for an organic EL display device, there do not occur problems such as generation of white spots or white turbidity of the Ag thin film, and pin holes or dark spots of the organic EL device.

Further, as described above, for pure Ag (or an Ag-based alloy), Ag atoms have a property of tending to move and being readily aggregated even with low-temperature heating (e.g., 200 to 400° C.). For this reason, even when pure Ag (or an Ag-based alloy) is used as a wiring film, not limited to use as a reflective film, the change in surface of the film due to aggregation of Ag is large. Thus, the electric resistivity of the wiring film increases, which unfavorably causes a short circuit or disconnection of wiring in the worst case.

In view of such circumstances, it is an object of the present invention to provide a reflective film which has been inhibited from being reduced in reflectivity by heating, and a wiring film which has been inhibited from being increased in electric resistivity, by specifying the Ag-based alloy with the composition such that aggregation of Ag atoms by heating is less likely to occur.

Solution to Problem

A reflective anode of the present invention which could solve the foregoing problems is a reflective anode for an organic EL display device formed on a substrate. The reflective anode includes: an Ag-based alloy film containing Nd in an amount of 0.01 (preferably 0.1) to 1.5 at %; and an oxide conductive film in direct contact with the Ag-based alloy film.

In the reflective anode, it is desirable that the Ag-based alloy film further contains one or more elements selected from Cu, Au, Pd, Bi, and Ge in a total amount of 0.01 to 1.5 at %.

Another reflective anode of the present invention which could solve the problems is a reflective anode for an organic EL display device formed on a substrate. The reflective anode includes: an Ag-based alloy film containing Bi in an amount of 0.01 to 4 at %; and an oxide conductive film in direct contact with the Ag-based alloy film.

In the reflective anode, it is desirable that the Ag-based alloy film further contains one or more elements selected from Cu, Au, Pd, and Ge in a total amount of 0.01 to 1.5 at %.

In the reflective anode, there is recommended a form in which the composition of the surface of the Ag-based alloy film is $Bi_2O_3$.

In the reflective anode, it is desirable that the Ag-based alloy film further contains one or more selected from rare earth elements in a total amount of 0.01 to 2 at %.

In the reflective anode, it is desirable that the Ag-based alloy film further contains Nd and/or Y in a total amount of 0.01 to 2 at %.

In the reflective anode, it is desirable that the Ag-based alloy film further contains one or more elements selected from the group consisting of Au, Cu, Pt, Pd, and Rh in a total amount of 3 at % or less (not inclusive of 0 at %).

In the reflective anode, it is desirable that the ten-point mean roughness Rz of the Ag-based alloy film surface is 20 nm or less.

In the reflective anode, it is desirable that the Ag-based alloy film is formed by a sputtering method or a vacuum deposition method.

In a thin-film transistor substrate of the present invention which could solve the problems, the Ag-based alloy film in the reflective anode is electrically connected with source/drain electrodes of a thin-film transistor formed on the substrate.

An organic EL display device of the present invention which could solve the problems includes the thin-film transistor substrate.

A sputtering target of the present invention which could solve the problems is a sputtering target for forming the reflective anode.

A wiring film of the present invention which could solve the problems is a wiring film for an organic EL display device formed on a substrate. The wiring film includes an Ag-based alloy film containing Nd in an amount of 0.01 to 1.5 at %.

In the wiring film, it is desirable that the content of Nd is set at 0.1 to 1.5 at %.

In the wiring film, it is desirable that the Ag-based alloy film further contains one or more elements selected from Cu, Au, Pd, Bi, and Ge in a total amount of 0.01 to 1.5 at %.

Another wiring film of the present invention which could solve the problems is a wiring film for an organic EL display device formed on a substrate. The wiring film includes an Ag-based alloy film containing Bi in an amount of 0.01 to 4 at %.

In the wiring film, it is desirable that the Ag-based alloy film further contains one or more elements selected from Cu, Au, Pd, and Ge in a total amount of 0.01 to 1.5 at %.

A sputtering target of the present invention which could solve the problems is a sputtering target for forming the wiring film.

Advantageous Effects of Invention

In accordance with the present invention, the Ag-based alloy in the reflective anode is excellent in heat resistance and moisture resistance, and has a high smoothness. For this reason, despite that an oxide conductive film such as ITO in direct contact thereon is stacked, the Ag-based alloy has a high smoothness. As a result, it becomes possible to avoid the deterioration phenomena characteristic of an organic EL display device, such as dark spots without forming pin holes in the organic material forming the organic EL layer. Further, the Ag-based alloy is also excellent in electric resistivity, and hence is also useful as the wiring film of the organic EL display device.

DESCRIPTION OF EMBODIMENTS

Figure 1:
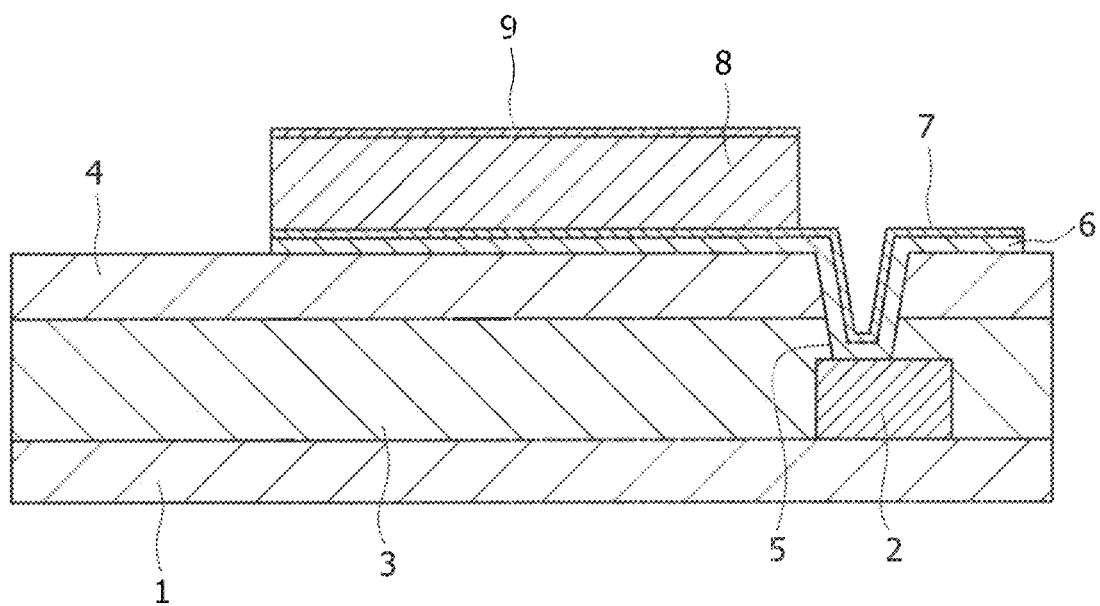
FIG. 1 is a cross-sectional view of a thin-film transistor substrate including a reflective anode in Embodiment of the present invention.

Below, a description will be given to a reflective anode in Embodiment of the present invention. First, in order to describe the positional relationship of the reflective anode in a thin-film transistor substrate, a description will be given to the cross section of the thin-film transistor substrate for use in an organic EL device. FIG. 1 is a cross-sectional view of the thin-film transistor substrate.

In FIG. 1, on a substrate 1, a thin-film transistor (TFT) 2 and a passivation film 3 are formed. Further, thereon, a planarization layer 4 is formed. On the TFT 2, a contact hole 5 is formed. Source/drain electrodes (not shown) of the TFT 2 and an Al-based alloy film 6 are electrically connected through the contact hole 5.

On the Al-based alloy film 6, an oxide conductive film 7 is formed. The Al-based alloy film 6 and the oxide conductive film 7 form the reflective anode of the present invention. This is referred to as the reflective anode for the following reason. The Al-based alloy film 6 and the oxide conductive film 7 act as the reflective electrode of the organic EL device. In addition, the Al-based alloy film 6 and the oxide conductive film 7 are electrically connected to the source/drain electrodes of the TFT 2, and hence act as the anode.

On the oxide conductive film 7, an organic light-emitting layer 8 is formed. Further, thereon, a cathode 9 (such as an oxide conductive film) is formed. Such an organic EL display device can achieve an excellent emission luminance because the light emitted from the organic light-emitting layer 8 is reflected by the reflective anode of the present invention with efficiency. A higher reflectivity is more desirable, and, desirably, the reflectivity is 85% or more, and preferably 87% or more.

In the reflective anode in the present embodiment, the Ag-based alloy film 6 contains Nd in an amount of 0.1 to 1.5 at %, or Bi in an amount of 0.01 to 4 at %, and the balance includes Ag and inevitable impurities. Nd has an action of preventing aggregation of Ag. In order for the effect of sufficiently avoiding the dark spot phenomenon in the organic EL device to be exerted, Nd is required to be added in an amount of 0.01 at % or more (preferably 0.05 at or more, more preferably 0.1 at or more, further preferably 0.15 at % or more, and still further preferably 0.2 at % or more). On the other hand, even when the amount of Nd added is too large, the effect is saturated. For this reason, the upper limit of the amount of Nd added is 1.5 at % or less (more preferably 1.3 at % or less, and further preferably 1.0 at % or less).

The Nd-containing Ag-based alloy film 6 desirably further contains one or more elements selected from Cu, Au, Pd, Bi, and Ge in a total amount of 0.01 to 1.5 at %. This is for the following reason: Cu, Au, Pd, Bi, and Ge have an effect of further refining the crystal structure of the Ag-based alloy film 6 at the early stage of formation.

Addition of Bi also has an action of preventing Ag aggregation. In order for the effect of sufficiently avoiding the dark spot phenomenon in the organic EL device to be exerted, Bi is required to be added in an amount of 0.01 at or more (more preferably 0.02 at or more, and further preferably 0.03 at or more). On the other hand, even when the amount of Bi added is too large, the effect is saturated. For this reason, the upper limit of the amount of Bi added is 4 at or less (more preferably 2 at or less, and further preferably 1 at % or less).

The Bi-containing Ag-based alloy film 6 desirably further contains one or more elements selected from Cu, Au, Pd, and Ge in a total amount of 0.01 to 1.5 at %. This is for the following reason: Cu, Au, Pd, and Ge have an effect of further refining the crystal structure of the Ag-based alloy film 6 at the early stage of formation.

The Bi-containing Ag-based alloy film 6 desirably further contains one or more rare earth elements in a total amount of 0.01 to 2 at %. The total content of rare earth elements is more preferably 0.1 to 1.5 at %. This is for the following reason: the rare earth elements have an effect of inhibiting growth and diffusion of crystal grains by heating, and preventing aggregation.

Out of the rare earth elements, Nd and Y produce a particularly remarkable effect. Therefore, the Bi-containing Ag-based alloy film 6 desirably contains Nd and/or Y in a total amount of 0.01 to 2 at %. The more preferable content is 0.03 to 1 at %.

The Bi-containing Ag-based alloy film 6 desirably further contains one or more elements selected from the group consisting of Au, Cu, Pt, Pd, and Rh in a total amount of 3 at % or less (more preferably 2 at % or less) (not inclusive of 0 at %). As a result, the Ag-based alloy film 6 is excellent in heat resistance and moisture resistance, and has a high reflectivity due to the high flatness. Further, even when the oxide conductive film 7 is directly stacked thereon, the reflectivity can be maintained. This is for the following reason: the smoothness of the Ag-based alloy film 6 surface is maintained by prevention of Ag aggregation, and hence the deterioration of the oxide conductive film 7 can be inhibited in such a sense as to include inhibition of the surface unevenness of the oxide conductive film 7 and inhibition of whiskers containing In, Sn, and the like.

In both of the cases where the Ag-based alloy film 6 contains Nd and contains Bi, when the ten-point mean roughness Rz of the surface of the Ag-based alloy film 6 is 20 nm or less (more preferably 10 nm or less), the formation of pin holes in the overlying organic light-emitting layer 8 can be inhibited effectively. This can avoid the characteristic deterioration such as dark spot.

The reflective anode of an organic EL display device using a lamination film of such an oxide conductive film (ITO) and the Ag-based alloy film 6 has a reflectivity equivalent to that of pure Ag. Even when the oxide conductive film 7 (ITO) is stacked, the reflectivity is not reduced.

Further, when such a reflective anode is used, the contact resistance between the oxide conductive film 7 and the Ag-based alloy film 6 can be kept low. Therefore, it is possible to obtain an organic EL display device having a high emission luminance.

The Ag-based alloy film 6 can be manufactured by a sputtering target whose component composition has been adjusted to a prescribed value.

Up to this point, the configuration of each Ag-based alloy film 6 in Embodiments of the present invention was described. However, the mechanism of the present invention can be roughly considered as follows.

A pure Ag film is low in heat resistance. For this reason, movement of atoms is caused by heating, resulting in occurrence of aggregation causing a change from a continuous uniform film into islands. Further, in a pure Ag film, movement of atoms is also caused even by low-temperature heating. Particularly, aggregation occurs remarkably under a wet atmosphere.

In the present invention, from the idea that aggregation of Ag is due to the mobility of Ag, a study was conducted on the improvement of the heat resistance of the Ag-based alloy film due to additive elements with the change in structure as an index. As a result, it has been revealed that addition of Nd, and further Cu, or Bi is very effective for the improvement of the heat resistance.

Further, a study was conducted on the phenomenon (which will be referred to as a "spontaneous double-layer film") in which during sputter-deposition of the Ag-based alloy film 6, alloy elements diffuse into the surface of the Ag-based alloy film 6 to form an alloy element-concentrated layer on the surface (upper layer). As a result, it has been found as follows: by addition of Bi, a $Bi_2O_3$ layer is formed at the upper layer on the side closer to the oxide conductive film 7; this produces an effect of allowing the lower-layer Ag—Bi alloy layer to have a high-reflectivity function while ensuring excellent heat resistance and moisture resistance. This led to the completion of the present invention.

Therefore, the following has been found: by practicing the present invention, there can be obtained an Ag-based alloy film which has an excellent surface smoothness before a heat treatment, and has an excellent surface smoothness and high heat resistance even after a heat treatment at 200° C. or more generally required on and after formation of the oxide conductive film 7, and further does not undergo aggregation and has an excellent surface smoothness even under a low-temperature wet atmosphere. Therefore, the Ag-based alloy film 6 has excellent heat resistance and moisture resistance, and a high smoothness. Therefore, even when the oxide conductive film 7 is stacked, the Ag-based alloy film 6 keeps a high smoothness, and can avoid the deterioration of a display characteristic such as dark spots without forming pin holes in the organic light-emitting layer 8.

Up to this point, a description was given to the case where the Ag-based alloy film 6 in accordance with the present invention was used as the reflective electrode in the organic EL device. The Ag-based alloy film 6 does not undergo aggregation even after a heat treatment at 200° C. or more, and is excellent in surface smoothness, and further has a low electric resistivity. For this reason, the Ag-based alloy film 6 is also a very effective material as a wiring film in an organic EL device.

Incidentally, the Ag-based alloy film contains Nd in an amount of 0.01 to 1.5 at %; the Nd content is desirably 0.1 to 1.5 at %; and further, one or more elements selected from Cu, Au, Pd, Bi, and Ge are desirably contained in a total amount of 0.01 to 1.5 at %. In addition, the more preferable content of these alloy elements is the same as that in the case where the Ag-based alloy film 6 is used as a reflective electrode, and hence is not described.

Further, the Ag-based alloy film may contain Bi in an amount of 0.01 to 4 at %; further, one or more elements selected from Cu, Au, Pd, and Ge are desirably contained in a total amount of 0.01 to 1.5 at %. In addition, the more preferable content of these alloy elements is the same as that in the case where the Ag-based alloy film 6 is used as a reflective electrode, and hence is not described.

EXAMPLES

Below, the present invention will be described further specifically by way of examples. The present invention is not limited to the following examples. It is naturally understood that the present invention can also be practiced by being appropriately changed within a range adaptable to the gist described above and below. All of these are included in the technical range of the present invention.

Example 1

Using a disk-like glass (Corning non-alkaline glass #1737, diameter: 50 mm, thickness: 0.7 mm) as a material for the substrate 1, a SiN film of the passivation film 3 was deposited at a substrate temperature: 280° C., and with a thickness: 300 nm. Further, using a DC magnetron sputtering device, on the surface of the passivation film 3, there were deposited 1000-angstrom-thick Ag-based alloy film 6 of Ag—(X)Nd—(Y)Cu (X: 0.2 to 0.7 at %, Y: 0.3 to 0.9 at %) and Ag-based alloy film 6 of Ag—(X) Bi (X: 0.1 to 1.0 at %) thin film. The deposition conditions at this step were as follows. Substrate temperature: room temperature, Ar gas pressure: 1 to 3 mTorr, interpole distance: 55 mm, and deposition rate: 7.0 to 8.0 nm/sec. Further, the ultimate vacuum before deposition of the Ag-based alloy film 6 was $1.0 \times 10^{-5}$ Torr or less.

Then, samples in each of which deposition of the Ag-based alloy film 6 had been completed were divided into three groups (A to C). The samples of Group A were subjected to a heat treatment. The heat treatment was performed at a temperature of 200° C. under an oxygen atmosphere. Tables 1 and 2 show the results of respective reflectivities for the samples before the heat treatment and the samples after the heat treatment.

TABLE 1

| Composition | Reflectivity [%] ($\lambda$ = 550 nm) | | Surface roughness [nm] | |
|---|---|---|---|---|
| | Immediately after deposition | 200° C. heat treatment | Ra | Rz |
| Pure Ag | 95.5 | 94.0 | 4.2 | 43 |
| Ag—0.1Bi | 95.0 | 97.4 | 0.9 | 9 |
| Ag—0.5Bi | 95.2 | 96.5 | 0.8 | 8 |
| Ag—1.0Bi | 95.3 | 96.0 | 0.7 | 7 |

TABLE 2

| Composition | Reflectivity [%] ($\lambda$ = 550 nm) | | Surface roughness [nm] | |
|---|---|---|---|---|
| | Immediately after deposition | 200° C. heat treatment | Ra | Rz |
| Pure Ag | 95.5 | 94.0 | 4.2 | 43 |
| Ag—0.2Nd—0.3Cu | 96.4 | 97.6 | 0.6 | 7 |
| Ag—0.4Nd—0.6Cu | 96.2 | 96.6 | 0.5 | 6 |
| Ag—0.7Nd—0.9Cu | 95.0 | 95.2 | 0.5 | 5.5 |

As indicated from Tables 1 and 2, when a pure Ag film is used, the reflectivity of light is reduced by a 200-° C. heat treatment. However, in each example of Bi-added Ag and each example of Nd-added one, the reflectivity is rather improved by the heat treatment. As a result, the reflectivity of the Ag-based alloy film 6 is higher than that of the pure Ag film.

Then, the samples of the group B were measured by means of an AFM: Atomic Force Microscope to calculate the ten-point mean roughness (Rz) and the arithmetic mean roughness (Ra) of the surface of each Ag-based alloy film 6 (or pure Ag film). Tables 1 and 2 show the results. The atomic force microscope images for some of them are shown in FIG. 2 for reference.

Figure 2:
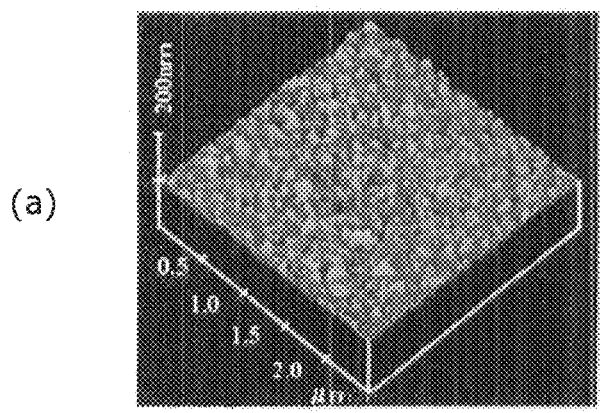
FIG. 2 are atomic force microscope images of Ag-based alloy films in Embodiments of the present invention.
Figure 2:
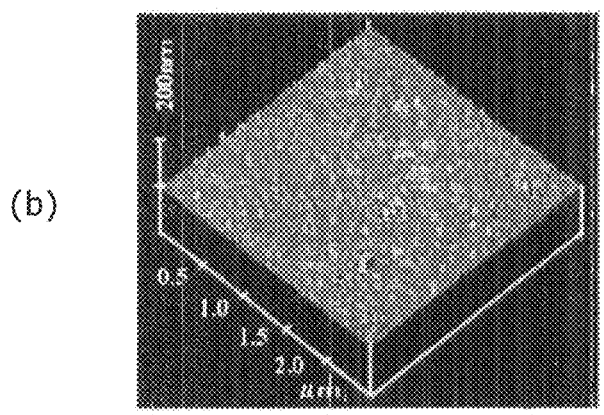
Figure 2:
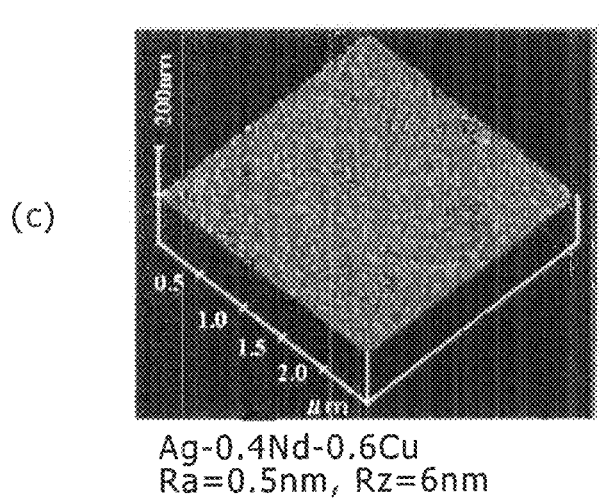

As indicated from Tables 1 and 2, and FIG. 2, the surface of the pure Ag film is very rough. However, the surface of each Bi- or Nd-added Ag-based alloy film 6 has a very high flatness.

Figure 3:
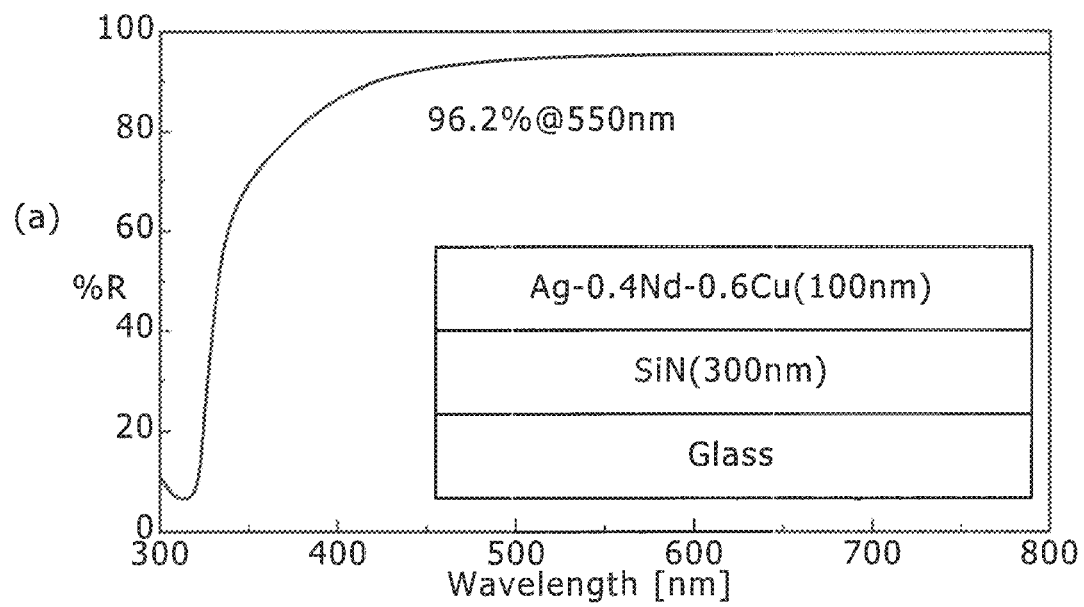
FIG. 3 are graphs each showing the reflectivity of the Ag-based alloy film in Embodiment of the present invention, wherein FIG. 3A corresponds to before deposition of an ITO film, and FIG. 3B corresponds to after deposition of the ITO film.
Figure 3:
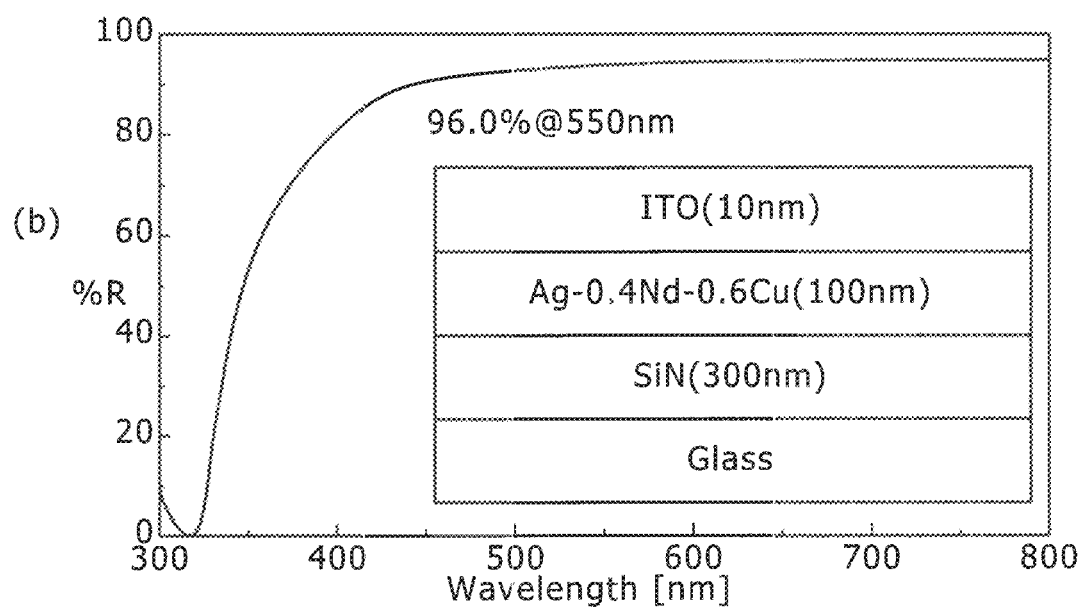

For the samples of the group C, on each Ag-based alloy film 6 (Ag-0.4Nd-0.6Cu, film thickness 100 nm), an ITO film (film thickness 10 nm) was sputter-deposited. Then, the reflectivities in the states before and after formation of the ITO film were measured. FIG. 3 the results.

As indicated from FIG. 3, the reflectivity, which was 96.2% before deposition of the ITO film, keeps 96.0% even after deposition.

Tables 3 and 4 show the results of measurements of the reflectivity immediately after deposition of the Ag-based alloy film 6, the reflectivity after performing a 200-° C. heat treatment upon formation of the Ag-based alloy film 6, and the reflectivity after performing a 200-° C. heat treatment upon formation of the ITO film on the Ag-based alloy film 6 for the sample of each composition of the group C.

TABLE 3

| | Reflectivity [%] (λ = 550 nm) | | |
|---|---|---|---|
| | Ag-based alloy film monolayer | | ITO film stacking 200° C. heat |
| Composition | Immediately after deposition | 200° C. heat treatment | treatment after deposition of ITO film |
| Pure Ag | 98.0 | 94.0 | 93.8 |
| Ag—0.1Bi | 95.0 | 97.4 | 97.2 |
| Ag—0.5Bi | 95.2 | 96.5 | 96.4 |
| Ag—1.0Bi | 95.3 | 96.0 | 96 |

TABLE 4

| | Reflectivity [%] (λ = 550 nm) | | |
|---|---|---|---|
| | Ag-based alloy film monolayer | | ITO film stacking 200° C. heat treatment after |
| Composition | Immediately after deposition | 200° C. heat treatment | deposition of ITO film |
| Pure Ag | 98.0 | 94.0 | 93.8 |
| Ag—0.2Nd—0.3Cu | 96.4 | 97.6 | 97.5 |
| Ag—0.4Nd—0.6Cu | 96.2 | 96.6 | 96.4 |
| Ag—0.7Nd—0.9Cu | 95.0 | 95.2 | 95.1 |

Figure 4:
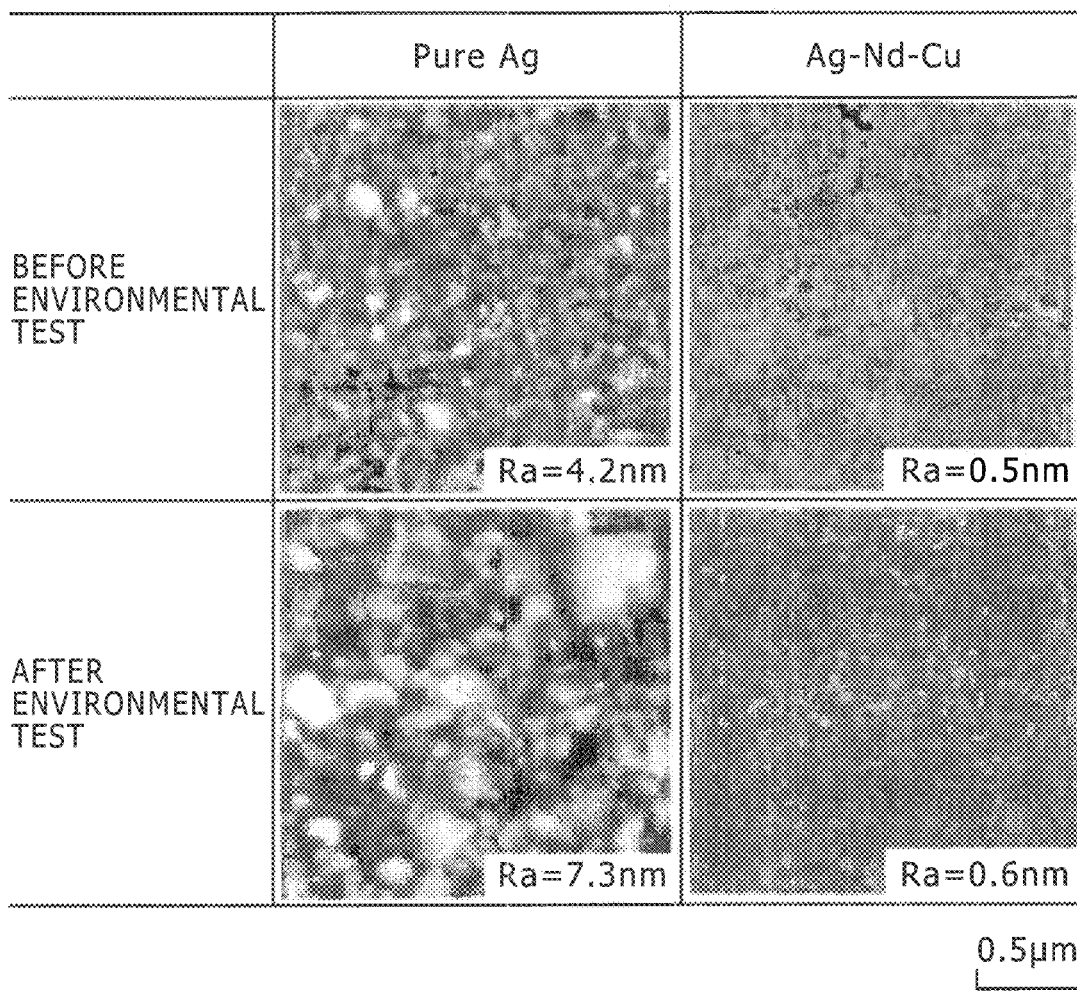
FIG. 4 is an atomic force microscope image of each Ag-based alloy film in Embodiment of the present invention.

As indicated from Table 3 and FIG. 4, each Ag-based alloy film keeps a higher reflectivity than that of the pure Ag film after performing a 200-° C. heat treatment upon formation of the ITO film.

As apparent from the foregoing results, in the present invention, the Ag—(X)Nd—(Y)Cu alloy and the Ag—(X)Bi alloy each have a higher reflectivity in either of before the heat treatment or after the heat treatment than that of pure Ag. Therefore, it has been shown that even when applied to a 200-° C. or more heat history after formation of the Ag-based alloy film 6 during the actual device manufacturing step, the Ag-based alloy film 6 is more excellent in smoothness of the surface than the pure Ag film.

Therefore, by using the reflective anode of the present invention, it is possible to inhibit the formation of dark spots due to pin holes resulting from the unevenness of the organic light-emitting layer surface. Further, the Ag-based alloy film 6 of the present invention has a reflectivity equivalent to or higher than that of pure Ag. Also when ITO of a transparent conductive film is stacked, the reflectivity does not show deterioration, and is favorable as with pure Ag. Accordingly, the reduction of the emission luminance which is the characteristic resulting from the reflectivity is not incurred.

Example 2

Using a disk-like glass (Corning non-alkaline glass #1737, diameter: 50 mm, thickness: 0.7 mm) as a material for the substrate 1, a SiN film of the passivation film 3 was deposited at a substrate temperature: 280° C., and with a thickness: 300 nm on the surface of the substrate 1. Further, using a DC magnetron sputtering device, an Ag-based alloy film of Ag-0.1Bi-0.2Nd, and an Ag-based alloy film 6 of Ag-0.1Bi-0.1Ge were deposited with a thickness of 1000 angstrom on the surface of the passivation film 3. The deposition conditions at this step were as follows. Substrate temperature: room temperature, Ar gas pressure: 1 to 3 mTorr, interpole distance: 55 mm, and deposition rate: 7.0 to 8.0 nm/sec. Further, the ultimate vacuum before deposition of the Ag-based alloy film 6 was $1.0 \times 10^{-5}$ Torr or less.

Then, samples in each of which deposition of the Ag-based alloy film 6 had been completed were subjected to a heat treatment at a heat treatment temperature: 250° C., for a heat treatment time: 1 hour, and under an oxygen atmosphere. Table 5 shows the results of measurements of respective reflectivities and surface roughnesses (Ra) for the samples before the heat treatment and the samples after the heat treatment. Incidentally, the heat treatment time of 1 hour was selected as an enough time for the reflectivities and the surface roughnesses not to change any more.

TABLE 5

| | Reflectivity [%] (λ = 550 nm) | | Surface roughness (Ra) [nm] | |
|---|---|---|---|---|
| Composition | Immediately after deposition | 250° C. heat treatment | Immediately after deposition | 250° C. heat treatment |
| Pure Ag | 97.0 | 92.7 | 4.2 | 6.2 |
| Ag—0.1Bi—0.2Nd | 96.4 | 97.6 | 0.53 | 0.65 |
| Ag—0.1Bi—0.1Ge | 96.9 | 97.8 | 0.62 | 0.74 |

As indicated from Table 5, when the pure Ag film is used, the reflectivity of light is reduced by the 250-° C. heat treatment. However, in each example of Bi—Nd-added Ag and each example of Bi—Ge-added one, the reflectivity is rather improved by the heat treatment. As a result, the reflectivity of the Ag-based alloy film 6 is higher than that of the pure Ag film.

For the measurement of the surface roughness (Ra), an AFM: Atomic Force Microscope was used to calculate the arithmetic mean roughness (Ra) of the surface of each Ag-based alloy film 6 (or pure Ag film).

As indicated from Table 5, the surface of the pure Ag film is very rough. However, the surface of each Bi—Nd- or Bi—Ge-added Ag-based alloy film 6 has a very high flatness.

Example 3

Out of the samples of the group A of Example 1, the ones in each of which the material for the Ag-based alloy film 6 was Ag—(X)Nd—(Y)Cu alloy (X: 0.7 at %, Y: 0.9 at %) were subjected to an environmental test (Aging Test). The environmental test was performed by exposing each sample under environment of a temperature of 80° C. and a humidity of 90% for 48 hours. Thus, the changes in surface roughness by AFM measurement were observed. FIG. 4 shows the results.

As apparent from FIG. 4, for the Ag-based alloy films in the present invention, the surface smoothness immediately after deposition (as-depo) is higher than that of pure Ag, and this scarcely changes even after the environmental test. This indicates that the aggregation resistance is improved by addition of Nd and Cu. In the present example, the example of Ag—Nd—Cu alloy was shown. However, even the Ag—Bi alloy provided the same results.

Example 4

Figure 5:
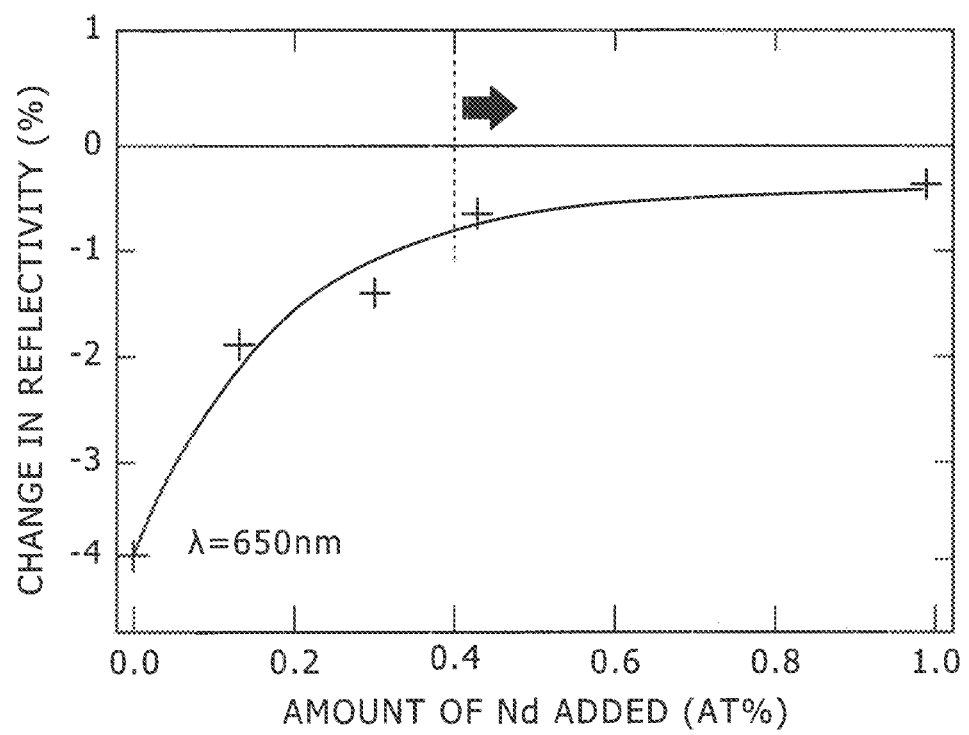
FIG. 5 is a view showing the changes in reflectivity (between before and after an environmental test) of the Ag-based alloy film in Embodiment of the present invention.

Then, in the reflective anode of the present invention, the Ag-based alloy film 6 was subjected to the same environmental test as in Example 3 to examine the degree of reduction of the reflectivity of the Ag-based alloy film 6 between before and after the environmental test. For this test, the one obtained by sputter-depositing an Ag—(X)Nd alloy (X: variously varying between 0.1 and 1.0 at %) was used. FIG. 5 shows the results.

As apparent from FIG. 5, for the Ag-based alloy film in the present invention, as compared with pure Ag, the reduction of the reflectivity after the environmental test is inhibited by adding Nd to Ag. This indicates that aggregation of the Ag-based alloy film has been inhibited. The effect increases with an increase in amount of Nd added. In the present example, the example of the Ag—Nd alloy was shown. However, even an Ag—Nd—Cu alloy or an Ag—Bi alloy can provide the same results.

Example 5

Using a disk-like glass (Corning non-alkaline glass #1737, diameter: 50 mm, thickness: 0.7 mm) as a material for the substrate 1, by a DC magnetron sputtering device, an Ag-based alloy film 6 with a thickness of 1000 angstrom (100 nm) was deposited on the surface of the substrate 1. The compositions used in the present Example are: (1) pure Ag, (2) pure Al, (3) Ag-0.9Pd-1.0Cu, (4) Ag-0.1Bi-0.2Nd, and (5) Ag-0.1Bi-0.1Ge (unit of composition is at %). The deposition conditions for the Ag-based alloy film 6 were as follows. Substrate temperature: room temperature, Ar gas pressure: 1 to 3 mTorr, interpole distance: 55 mm, and deposition rate: 7.0 to 8.0 nm/sec. Further, the ultimate vacuum before deposition of the Ag-based alloy film 6 was $1.0 \times 10^{-5}$ Torr or less.

Figure 6:
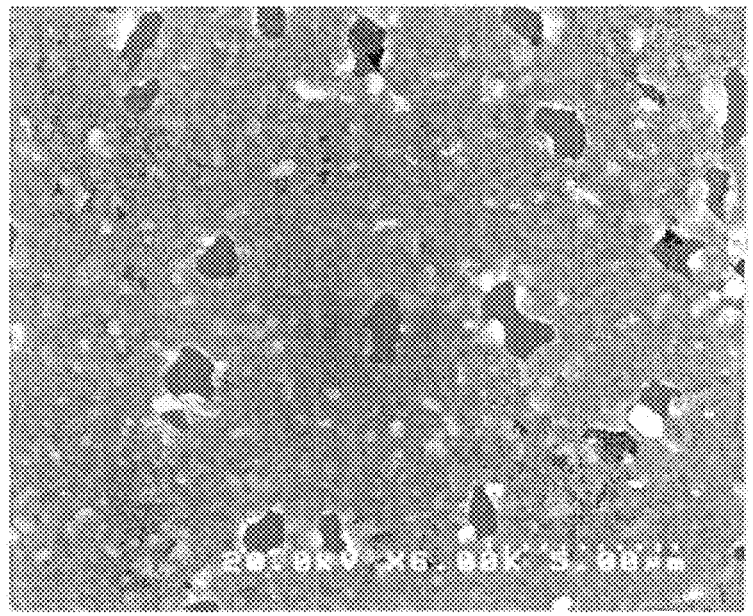
FIG. 6 are surface SEM images of Ag-based alloy films in Comparative Examples of the present invention.
Figure 6:
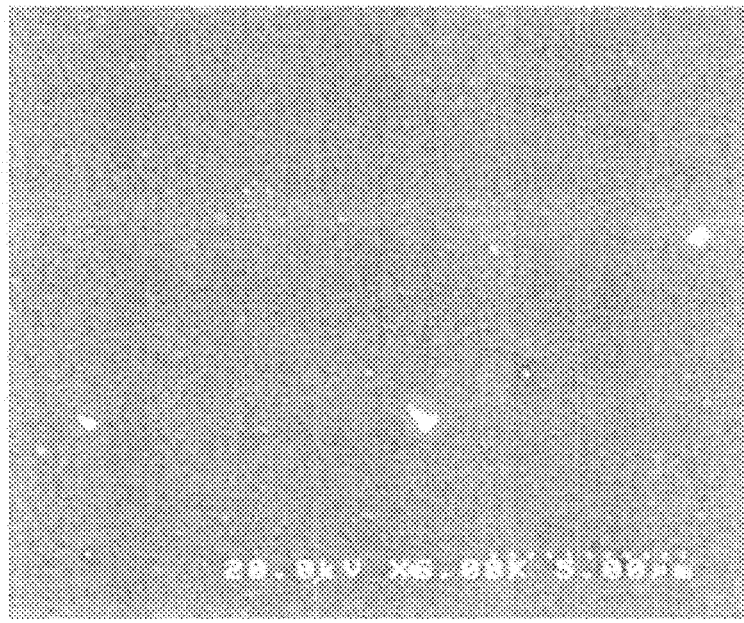
Figure 7:
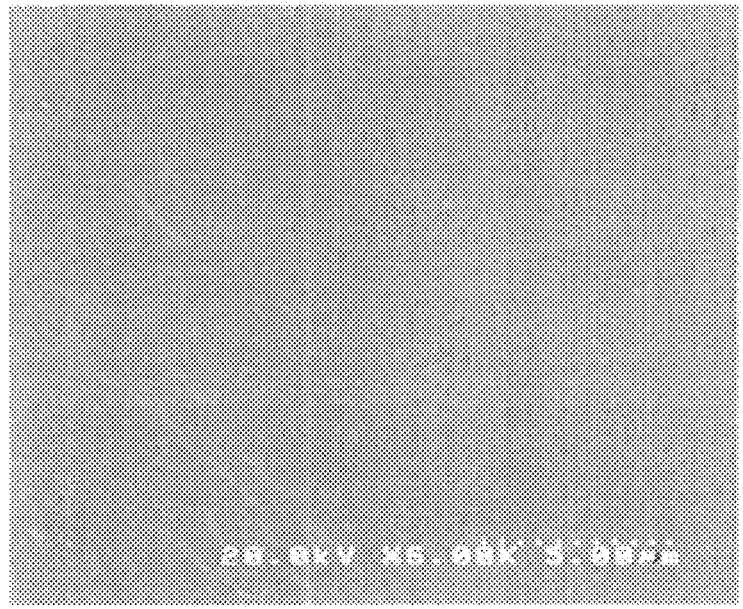
FIG. 7 are surface SEM images of Ag-based alloy films in Examples of the present invention
Figure 7:
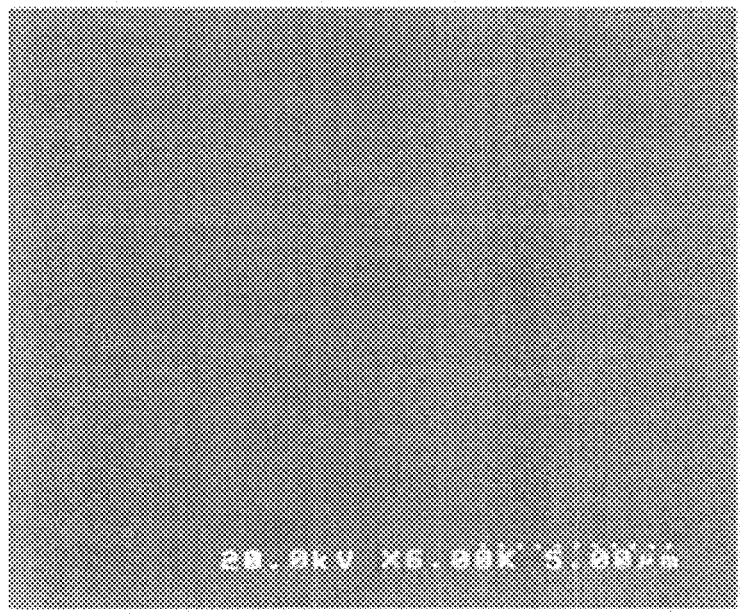

Then, samples in each of which deposition of the Ag-based alloy film 6 had been completed were divided into two groups (A and B). Only the samples of the group B were subjected to a heat treatment at a heat treatment temperature: 250° C., for a heat treatment time: 1 hour, and under an oxygen atmosphere. FIG. 6 and FIG. 7 are scanning electron microscope images (SEM images) obtained by observing the surfaces of the samples after the heat treatment at a magnification of 6000 times. FIG. 6 are the observed images of pure Ag and Ag-0.9Pd-1.0Cu, respectively, and correspond to Comparative Examples. FIG. 77B are the observed images of Ag-0.1Bi-0.2Nd and Ag-0.1Bi-0.1GE, respectively, and correspond to Examples. Whereas, Table 6 shows the electric resistivities of the samples immediately after deposition (before the heat treatment) and samples after the heat treatment of the Ag-based alloy films 6, respectively. As for the "surface roughness" of Table 6, relative judgment was done from the photographs of FIG. 6 and FIG. 7.

TABLE 6

| Composition | Electric resistivity [µΩ · cm] | | Surface roughness (after heat treatment) |
| --- | --- | --- | --- |
| | Immediately after deposition | After heat treatment | |
| Pure Ag | 3.65 | 2.80 | X |
| Pure Al | 4.9 | 3.5 | — |
| Ag—0.9at % Pd—1.0at % Cu | 4.62 | 3.21 | Δ |
| Ag—0.1at % Bi—0.2at % Nd | 4.12 | 3.11 | ○ |
| Ag—0.1at % Bi—0.1at % Ge | 3.55 | 2.45 | ○ |

First, it is shown that the surface configuration of pure Ag (FIG. 6A) has been largely changed after the heat treatment. Whereas, the surface configuration of the Ag—Pd—Cu alloy containing neither Nd nor Bi (FIG. 6B) has not changed as much as pure Ag, but is observed to have been partly changed. On the other hand, it is shown that the surface configurations of the Ag—Bi—Nd alloy (FIG. 7A) and the Ag—Bi—Ge alloy (FIG. 7B) are smooth even after the heat treatment. In other words, it is shown that aggregation of Ag is inhibited by allowing the Ag alloy to contain Nd and/or Bi.

Further, as shown in Table 6, for the Ag—Pd—Cu alloy containing neither Nd nor Bi, the electric resistivity is 3.21 µΩ·cm. In contrast, the Ag—Bi—Nd alloy and the Ag—Bi—Ge alloy each show a still lower value in electric resistivity, and are found to be usable as a wiring film as with commonly used Al materials. Incidentally, pure Ag also shows a low electric resistivity. However, as indicated from the surface photograph of FIG. 6A, in pure Ag, the degree of aggregation of Ag is large. When the degree of aggregation further increases, a short circuit or disconnection may be caused. For this reason, pure Ag is considered to be unusable as a wiring film.

As described up to this point, the present application was described in details, and by reference to specific embodiments. However, it is apparent to those skilled in the art that various changes and modifications may be made without departing from the spirit and scope of the present invention. The present application is based on Japanese Patent Application No. 2008-288084 filed on Nov. 10, 2008, Japanese Patent Application No. 2009-043409 filed on Feb. 26, 2009, and Japanese Patent Application No. 2009-186075 filed on Aug. 10, 2009, the contents of which are incorporated herein by reference.

| REFERENCE SIGNS LIST | |
| --- | --- |
| 1 | substrate |
| 2 | thin-film transistor (TFT) |
| 3 | passivation film |
| 4 | planarization layer |
| 5 | contact hole 5 |
| 6 | Al-based alloy film |
| 7 | oxide conductive film |
| 8 | organic light-emitting layer |
| 9 | cathode |

The invention claimed is:

1. A reflective anode for an organic EL display device formed on a substrate, comprising:
an Ag-based alloy film comprising Nd in an amount of 0.01 to 1.5 at % and at least one element selected from the group consisting of Au, Pd, and Ge in a total amount of 0.01 to 1.5 at %; and an oxide conductive film in direct contact with the Ag-based alloy film.

2. The reflective anode for an organic EL display device according to claim 1, wherein the content of Nd is 0.1 to 1.5 at %.

3. The reflective anode for an organic EL display device according to claim 1, wherein the Ag-based alloy film comprises at least one element selected from the group consisting of Pd and Ge in a total amount of 0.01 to 1.5 at %.

4. The reflective anode according to claim 1, wherein the ten-point mean roughness Rz of the Ag-based alloy film surface is 20 nm or less.

5. The reflective anode according to claim 1, wherein the Ag-based alloy film is formed by a sputtering method or a vacuum deposition method.

6. A thin-film transistor substrate comprising the reflective anode according to claim 1, wherein the Ag-based alloy film is electrically connected with source/drain electrodes of a thin-film transistor formed on the substrate.

7. A sputtering target for forming the reflective anode according to claim 1.

8. The reflective anode for an organic EL display device according to claim 1, wherein the Ag-based alloy film comprises Pd in an amount of 0.01 to 1.5 at %.

9. An organic EL display device comprising the thin-film transistor substrate according to claim 6.

10. A reflective anode for an organic EL display device formed on a substrate, comprising:
an Ag-based alloy film comprising Bi in an amount of 0.01 to 4 at % and Ge in an amount of 0.01 to 1.5 at %; and an oxide conductive film in direct contact with the Ag-based alloy film.

11. The reflective anode for an organic EL display device according to claim 10, wherein the Ag-based alloy film further comprises at least one element selected from the group consisting of Cu, Au, and Pd, wherein the total amount of Cu, Au, Pd, and Ge is 0.01 to 1.5 at %.

12. The reflective anode for an organic EL display device according to claim 10, wherein the composition of the surface of the Ag-based alloy film is $Bi_2O_3$.

13. The reflective anode according to claim 10, wherein the Ag-based alloy film further comprises at least one rare earth element in a total amount of 0.01 to 2 at %.

14. The reflective anode according to claim 10, wherein the Ag-based alloy film further comprises Nd and/or Y in a total amount of 0.01 to 2 at %.

15. The reflective anode according to claim 10, wherein the Ag-based alloy film further comprises at least one element selected from the group consisting of Au, Cu, Pt, Pd, and Rh in a total amount of 3 at % or less, not including 0%.

16. A wiring film for an organic EL display device formed on a substrate, comprising:
at least an Ag-based alloy film comprising Nd in an amount of 0.01 to 1.5 at % and at least one element selected from the group consisting of Au, Pd, and Ge in a total amount of 0.01 to 1.5 at %.

17. The wiring film according to claim 16, wherein the content of Nd is 0.1 to 1.5 at %.

18. The wiring film according to claim 16, wherein the Ag-based alloy film further comprises at least one element selected from the group consisting of Pd and Ge in a total amount of 0.01 to 1.5 at %.

19. A sputtering target for forming the wiring film according to claim 16.

20. The wiring film according to claim 16, wherein the Ag-based alloy film further comprises Pd in an amount of 0.01 to 1.5 at %.

21. A wiring film for an organic EL display device formed on a substrate, comprising:
at least an Ag-based alloy film comprising Bi in an amount of 0.01 to 4 at % and Ge in an amount of 0.01 to 1.5 at %.

22. The wiring film according to claim 21, wherein the Ag-based alloy film further comprises at least one element selected from the group consisting of Cu, Au, and Pd, wherein the total amount of Cu, Au, Pd, and Ge is 0.01 to 1.5 at %.

* * * * *